United States Patent [19]

Marrah et al.

[11] Patent Number: 4,933,974

[45] Date of Patent: Jun. 12, 1990

[54] SWITCHED CAPACITOR PILOT PHASE AND MAGNITUDE DETECTOR

[75] Inventors: Jeffrey J. Marrah; Gregory J. Manlove, both of Kokomo; Richard A. Kennedy, Russiaville, all of Ind.

[73] Assignee: Delco Electronics Corporation, Kokomo, Ind.

[21] Appl. No.: 393,499

[22] Filed: Aug. 14, 1989

[51] Int. Cl.$^5$ .............................................. H04H 5/00
[52] U.S. Cl. .......................................... 381/7; 381/13
[58] Field of Search ..................... 381/2, 3, 4, 13, 7

[56] References Cited

U.S. PATENT DOCUMENTS

| | | | |
|---|---|---|---|
| 4,569,072 | 2/1986 | van Roermund | 381/13 |
| 4,723,286 | 2/1988 | Kamp | 381/3 |
| 4,860,354 | 8/1989 | van Roermund | 381/10 |

*Primary Examiner*—Forester W. Isen
*Attorney, Agent, or Firm*—Albert F. Duke

[57] ABSTRACT

A switched capacitor low pass filter is used to sample an FM stereo composite signal with non-overlapping clock signal to achieve phase or magnitude detection of the 19 kHz pilot without being adversely affected by the presence of information at or about 57 kHz.

8 Claims, 10 Drawing Sheets

SWITCHED CAPACITOR PILOT PHASE AND MAGNITUDE DETECTOR

FIELD OF THE INVENTION

This invention relates to switched capacitor phase and magnitude detectors and more particularly to a method of clocking such detectors in order to extract information from an FM stereo composite signal regarding the phase and magnitude of the 19 kHz pilot signal without being adversely affected by the presence of a 57 kHz pilot signal.

BACKGROUND OF THE INVENTION

Phase and magnitude detectors are common circuits used in communication systems. FM stereo decoders use the phase detector as a part of the phase-locked loop (PLL). The PLL is used to lock to the 19 kHz pilot signal added to the FM composite for synchronization of the transmitter and receiver. The magnitude detector is used to detect the presence of the pilot. The presence of a valid pilot impacts the audio processing of the signal and controls illumination of a stereo indicator light.

FIG. 1 shows a block diagram of a conventional PLL of an FM stereo decoder. The input composite is applied to a phase detector, which develops a DC error voltage proportional to the difference in phase between the pilot and the 19 kHz signal fed back to the detector. The output of the phase detector passes through a loop filter and is applied to a voltage controlled oscillator (VCO). The error voltage drives the output of the VCO to produce a 76 kHz signal in phase with the 19 kHz pilot. The output of the VCO is divided to provide an in-phase 38 kHz and both in-phase and quadrature 19 kHz signals. The 38 kHz signal is used to decode the input composite. The in-phase and quadrature 19 kHz provide the other inputs to phase and magnitude detectors. When the input pilot and VCO feedback are in phase, the DC output of the phase detector is zero.

The composite input is also fed to a magnitude detector the output of which is fed to a lowpass filter to generate a DC signal proportional to the amplitude of the 19 kHz pilot. This DC signal is compared with a reference voltage in a comparator to generate a digital output. If the magnitude detector output is greater than the reference, the comparator is high and a valid pilot is indicated. Otherwise, the comparator output is low, and a monophonic input signal is presumed. When the input pilot and VCO feedback are in phase, the DC output of the magnitude detector is maximum.

The magnitude and phase detectors discussed above may take the form of simple multipliers clocked by 50 percent duty cycle 19 kHz clock signals. The only difference between the two detectors is the fact that the clock signals for the magnitude detector are phase displaced by 90 degrees from the clock signals of the phase detector. These multipliers can be implemented in CMOS or bipolar technology and are well known to those skilled in the art.

If the input to the multiplier used for phase or magnitude detection is a sinewave as shown in FIG. 2A (19 kHz in the above example), multiplication by a squarewave of the same frequency will produce a DC voltage proportional to either the phase or magnitude of the sinewave. In a PLL, the output of the phase detector is forced to be zero through feedback. The squarewave shown in FIG. 2B, when multiplied with the sinewave of FIG. 2A, produces the waveform of FIG. 2C. The multiplication process can be thought of as reversing the polarity of the sinewave at a rate equal to the frequency of the squarewave. In this case, the input sinusoid is being multiplied by plus one or minus one to generate the output. If the phase relationship between the input and the clock are as displayed in FIGS. 2A and 2B, the low passed output will be zero volts as shown in FIG. 2D. The low passed output will move away from zero volts as the phase difference between the input and clock signal changes from zero degrees. The PLL acts as a low pass filter and only responds to the DC of the waveform in FIG. 2C.

The clock signal of the magnitude detector is shown in FIG. 2E and is shifted 90 degrees from the phase detector clock of FIG. 2B. When the incoming sinewave is multiplied by this squarewave, the resulting output will be a rectified version of the input as shown in FIG. 2F. This signal is low pass filtered to generate a DC voltage directly proportional to the magnitude of the incoming sinewave as shown in FIG. 2G.

The conventional multiplying detectors described with reference to FIG. 2 provide suitable responses for many applications. The main problem with this type of detector is that the circuit responds to all odd harmonics of the squarewave clocking signal. Referring to FIG. 3A the transient response of the squarewave clock signal of the magnitude detector is shown. As is well known the signal contains frequency components which are integer multiples of the fundamental (in this case 19 kHz). A single frequency component in the time domain is represented as an impulse in the frequency domain of amplitude proportional to the amplitude of the component (a sinewave would have one impulse at the fundamental frequency). A squarewave exhibits odd harmonics. Thus a 19 kHz squareware contains components at 19 kHz, 57 kHz, 95 kHz etc as shown in FIG. 3B. FIGS. 3C and 3D show the transient and frequency response of the squarewave clock signal of the phase detector. It differs from the magnitude detector frequency response due to the opposite sign of every other harmonic.

Information at 95 kHz and beyond is not important to the performance of a FM stereo decoder system because it is outside the bandwidth of interest; however, 57 kHz can be of significant importance. The addition of information beyond the FM composite bandwidth of 53 kHz is being considered in both Europe and the United States. For example, Advanced Road Information (ARI) and Radio Data System (RDS) contain pilot information at and about 57 kHz. Standard magnitude and phase detector circuits such as described above, using 50 percent duty cycle squarewave clock signals, are adversely affected by the ARI and RDS signals. The frequency response of these clock signals indicates this; however, a discussion of the time response will best illustrate the problems.

Referring to FIG. 4A, two in-phase input sinewaves, one at 19 kHz and one at 57 kHz are shown. FIG. 4B shows the 19 kHz phase detector squarewave which is the same as shown in FIG. 2B. FIGS. 4C and 4D show the transient and DC output of the phase detector, respectively, to a 57 kHz input. The output DC is still zero; however, the phase response is negative at 57 kHz and will reduce the gain of the 19 kHz phase detector. This is because the frequency response of the third harmonic is opposite in sign to the fundamental, as shown in FIG. 3D. The reduction in gain has a negative impact on the characteristics of the PLL. FIG. 4E shows the 19 kHz magnitude detector squarewave clock signal while FIGS. 4F AND 4G show the transient and DC output of the magnitude detector, respectively, to a 57 kHz input. The DC output is not zero, and will have an adverse effect in detecting the magnitude of the 19 kHz pilot.

Switched capacitor sinewave multipliers have been proposed for use in various applications. See for example, "Switched-Capacitor Stereo Decoders for T.V. and Radio Receivers", IEEE Transactions on Consumer Electronics, Vol. CE-31, No. 3, Aug. 1985 which proposes using a switched capacitor sinewave multiplier as a phase detector. The sinusoidal phase detector is used to avoid the information at 57 kHz. The sine wave, by definition, has no harmonic content and only the desired 19 kHz pilot will affect the circuit.

While the sinusoidal detectors will avoid the problems of odd harmonics adversely impacting the operation of the system, they require a complicated capacitor array as well as a complicated clocking scheme. The digital logic used to generate the clocks is reasonably small, but the capacitor arrays can become large and difficult to layout in the integrated circuit. Also, it would obviously be impossible to lock on to a 57 kHz pilot, with this phase detector, if that function was desired.

SUMMARY OF THE INVENTION

Accordingly it is an object of the present invention to provide a switched capacitor phase detector which avoids the adverse impact of odd harmonics on system operation without the layout complications associated with the prior art sinewave multipliers.

For the FM stereo decoder application, a full sinusoidal multiplier is not required in order to perform the phase or magnitude detection function. A detector which does not exhibit a second, third, or fourth order harmonic is sufficient; all other frequencies being out of the band of interest. In accordance with the present invention a switched capacitor low pass filter of conventional design is operated by an unconventional clocking scheme which samples the input FM composite signal to extract phase and magnitude information from the 19 kHz pilot signal component without being adversely affected by the presence of a 57 kHz pilot signal component. The extraction of phase information is accomplished by alternately sampling the input with a positive and negative gain of unity during a predetermined time interval surrounding the zero crossing of the 19 kHz pilot. During this predetermined time interval a 19 kHz and a 57 kHz pilot will have substantially the same slope. During the remaining time intervals the input is not sampled. The phase detector clock signal does not contain a second and fourth harmonic and the third harmonic is of the same phase as the fundamental and consequently the presence of a 57 kHz pilot will actually improve the gain of the detector. Also, the PLL can lock onto a 57 kHz pilot, present in the ARI system, without the presence of a 19 kHz pilot.

The extraction of magnitude information is accomplished by alternately sampling the input with a positive and negative gain of unity during the aforementioned remaining time intervals. During the aforementioned predetermined time interval the input is not sampled. The magnitude detector clock signal does not contain a third harmonic component and consequently the presence of a 57 kHz pilot will have no impact on the output of the detector.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE PREFERRED EMBODIMENT

Figure 5:
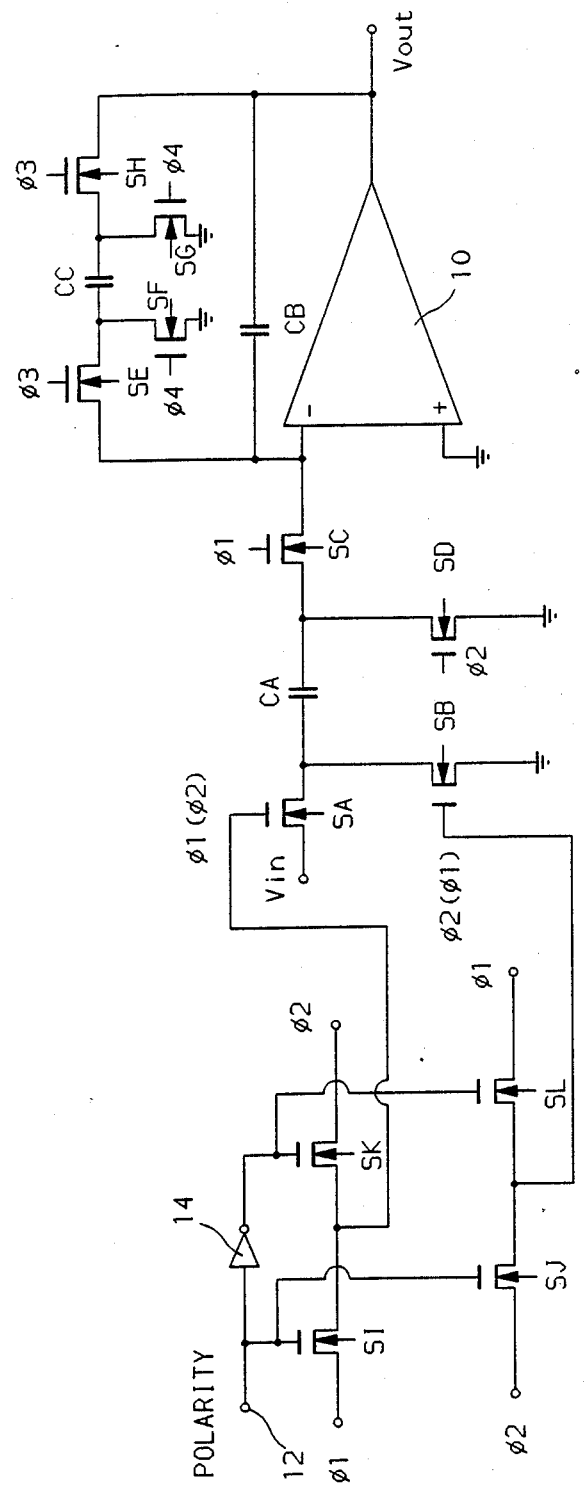
FIG. 5 is a diagram of a switched capacitor low pass filter.

Referring now to FIG. 5, the detector of the present invention is basically a switched capacitor lowpass filter with a synchronous rectifying input and includes switches SA,SB,SC,SD and capacitor CA. The switch SC is connected to the negative input of amplifier 10. Capacitor CB and the equivalent resistor formed by capacitor CC and switches SE, SF, SG, SH are connected between the output and negative input of the amplifier 10. The low pass filter is controlled by two sets of non-overlapping clock signals $\Phi 1$, $\Phi 2$ and 101 3, 4. Clock signals $\Phi 3$ and $\Phi 4$ are standard 50 percent duty cycle signals at a frequency of 38 kHz rate (twice the pilot) and control the switches SE, SF, SG, SH.

The clock signals $\Phi 1$, $\Phi 2$ are specially constructed as will be described below. The two input switches SA and SB are controlled by either $\Phi 1$ or $\Phi 2$, depending on a polarity pulse signal applied to the terminal 12. The switches SC and SD are controlled directly by $\Phi 1$ and $\Phi 2$ respectively. As is well known, a switched capacitor filter exhibits a negative gain when switches SA and SC are controlled by a clock of one phase and switches SB and SD are controlled by a clock of the opposite phase. Similarly, if switches SA and SD are controlled by a clock of one phase and switches SB and SC are controlled by a clock of the opposite phase, the filter will exhibit a positive gain. The switching between a gain of plus and minus one is controlled by a 50 percent duty cycle polarity pulse applied to switches SI, SJ and through inverter 14 to switches SK and SL. In FIG. 5, all the switches are shown as N-channel transistors but preferably they are implemented as CMOS transmission gates.

Figure 1:
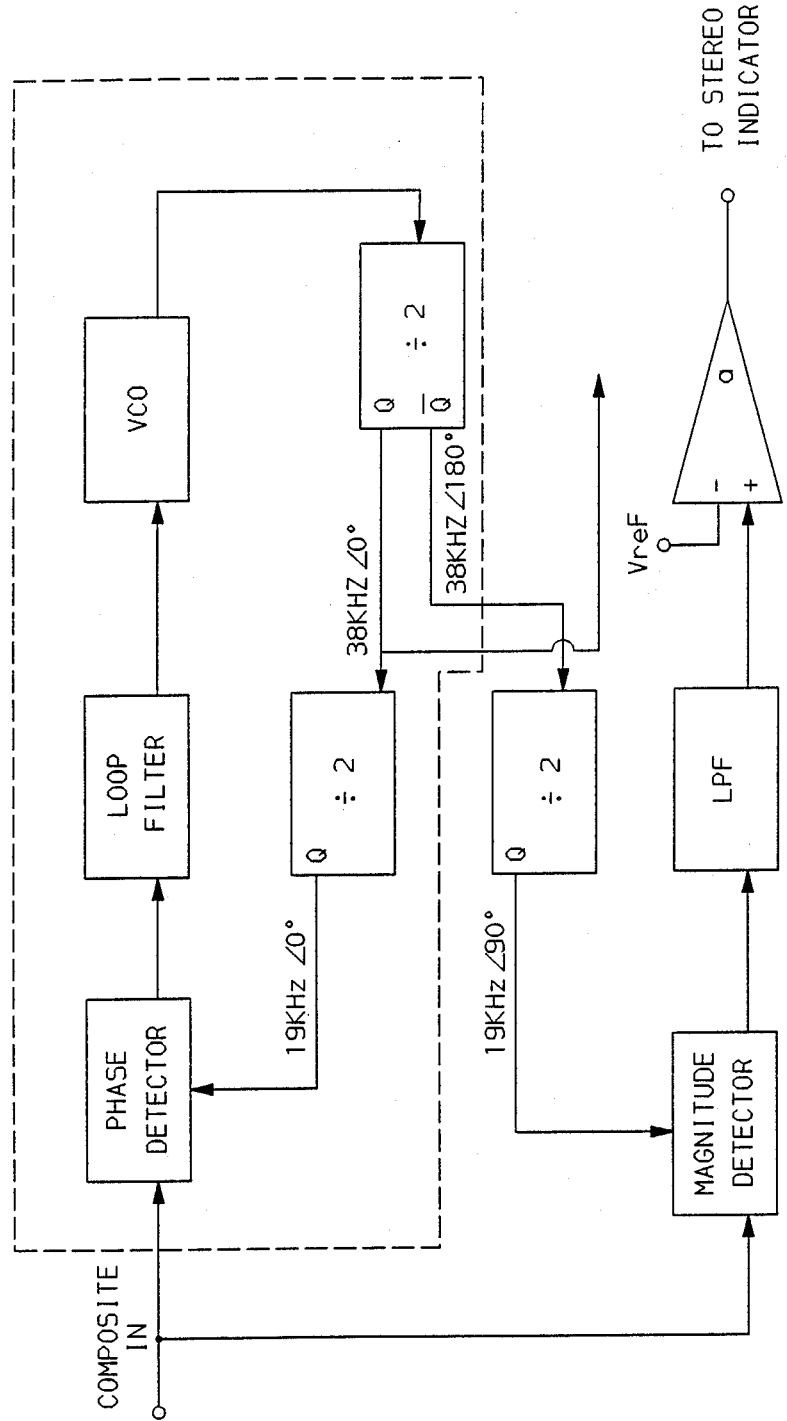
FIG. 1 shows a prior art phase-locked loop and magnitude detection circuitry used in an FM stereo decoder.
Figure 2:
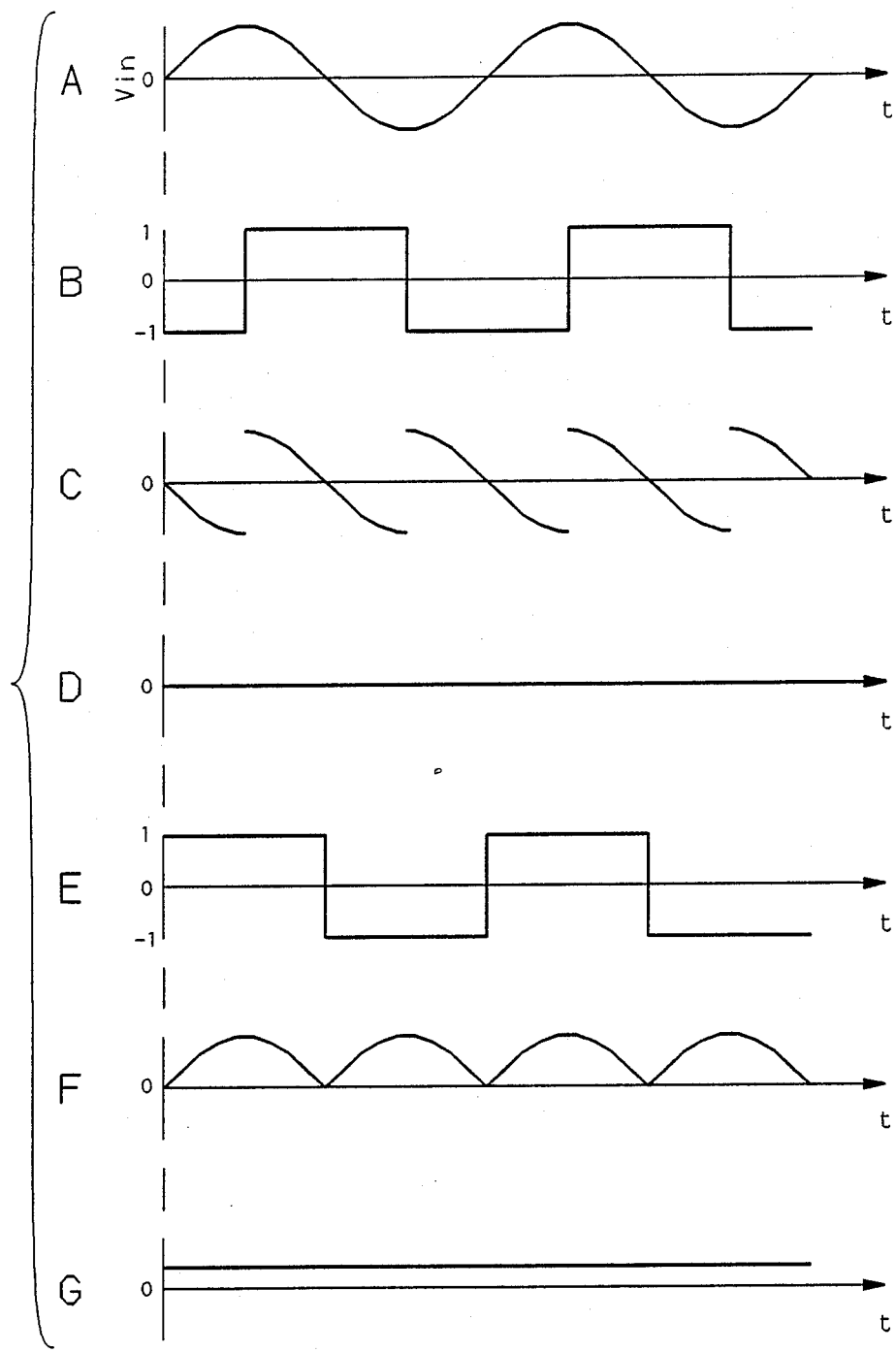
FIGS 2A-2G are waveforms useful in discussing the phase and magnitude response of prior art squarewave multipliers.
Figure 3:
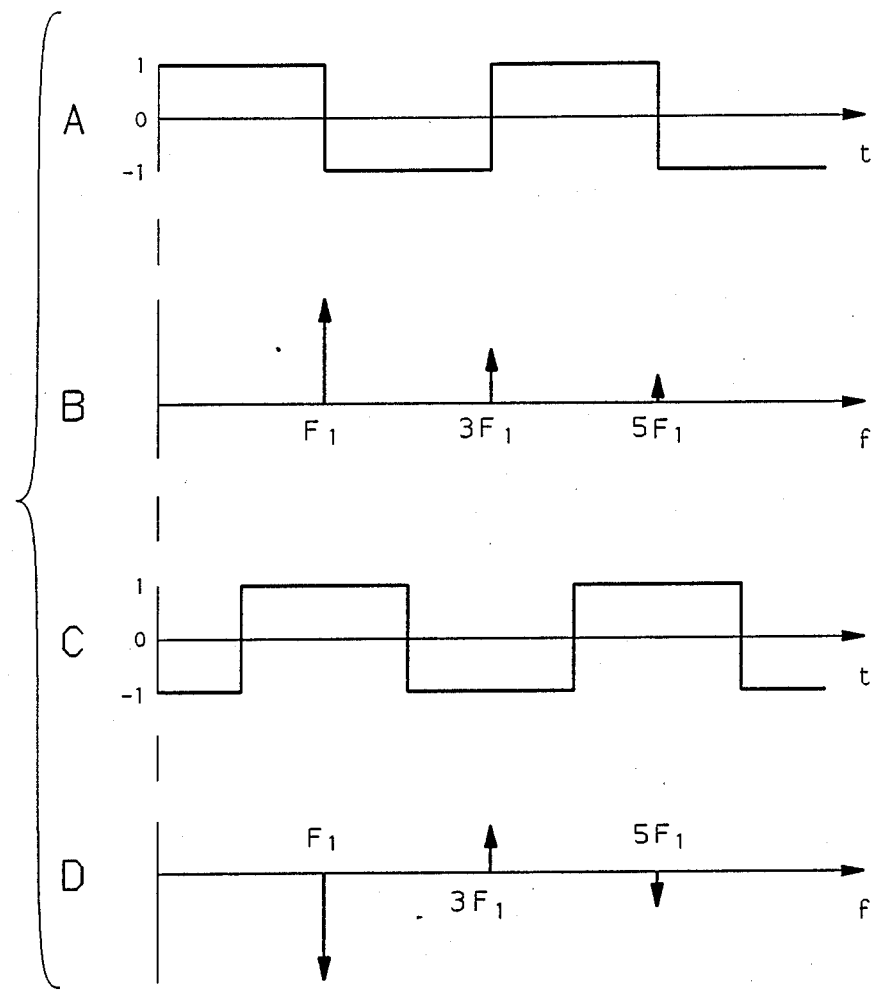
FIGS. 3A-3D show the frequency response of the squarewave clocking signal used in prior art magnitude and phase detectors.
Figure 4:
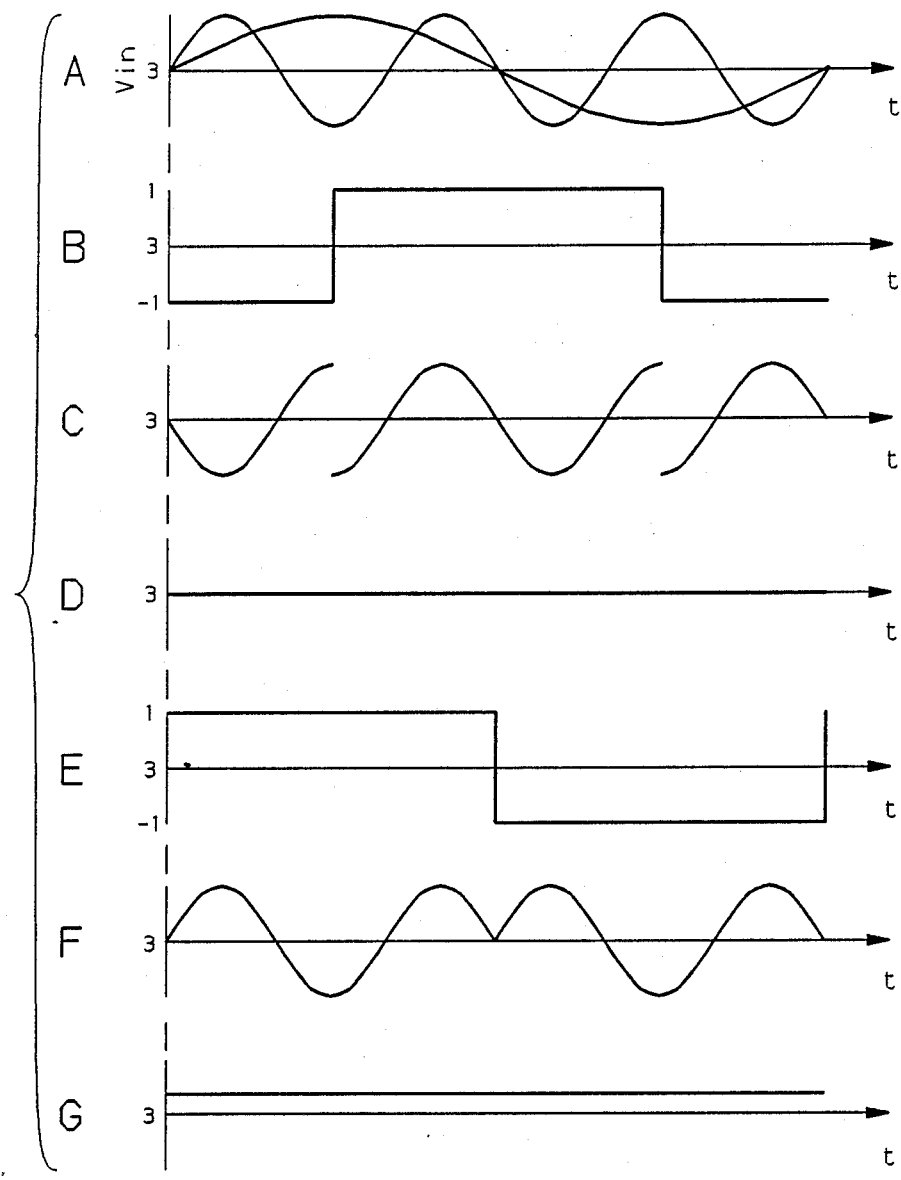
FIGS. 4A-4G show the conventional 19 kHz phase and magnitude detector responses to a 57 kHz pilot signal.
Figure 6:
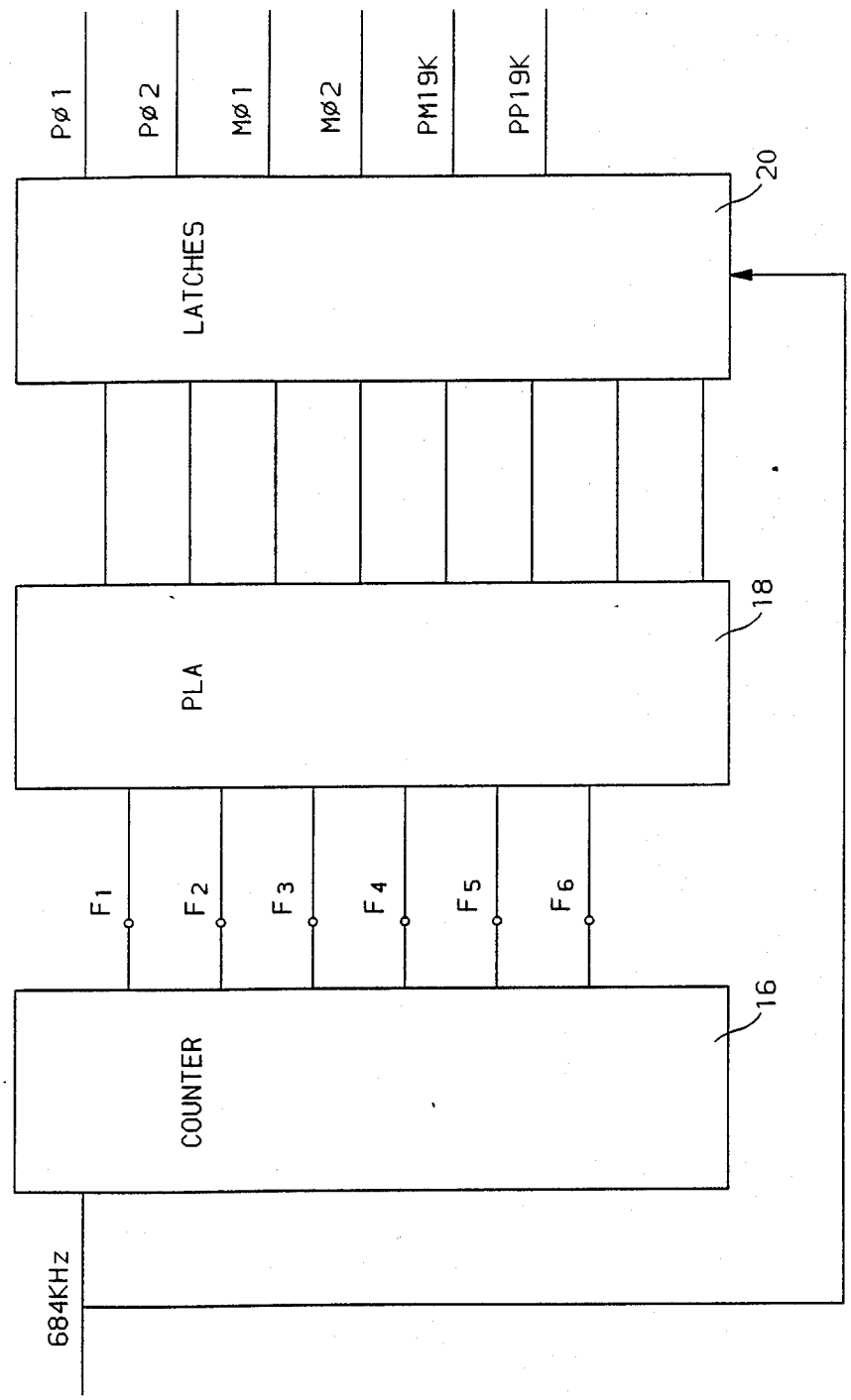
FIG. 6 is a block diagram of a digital state machine for producing the clocking signal used in the present invention.
Figure 7:
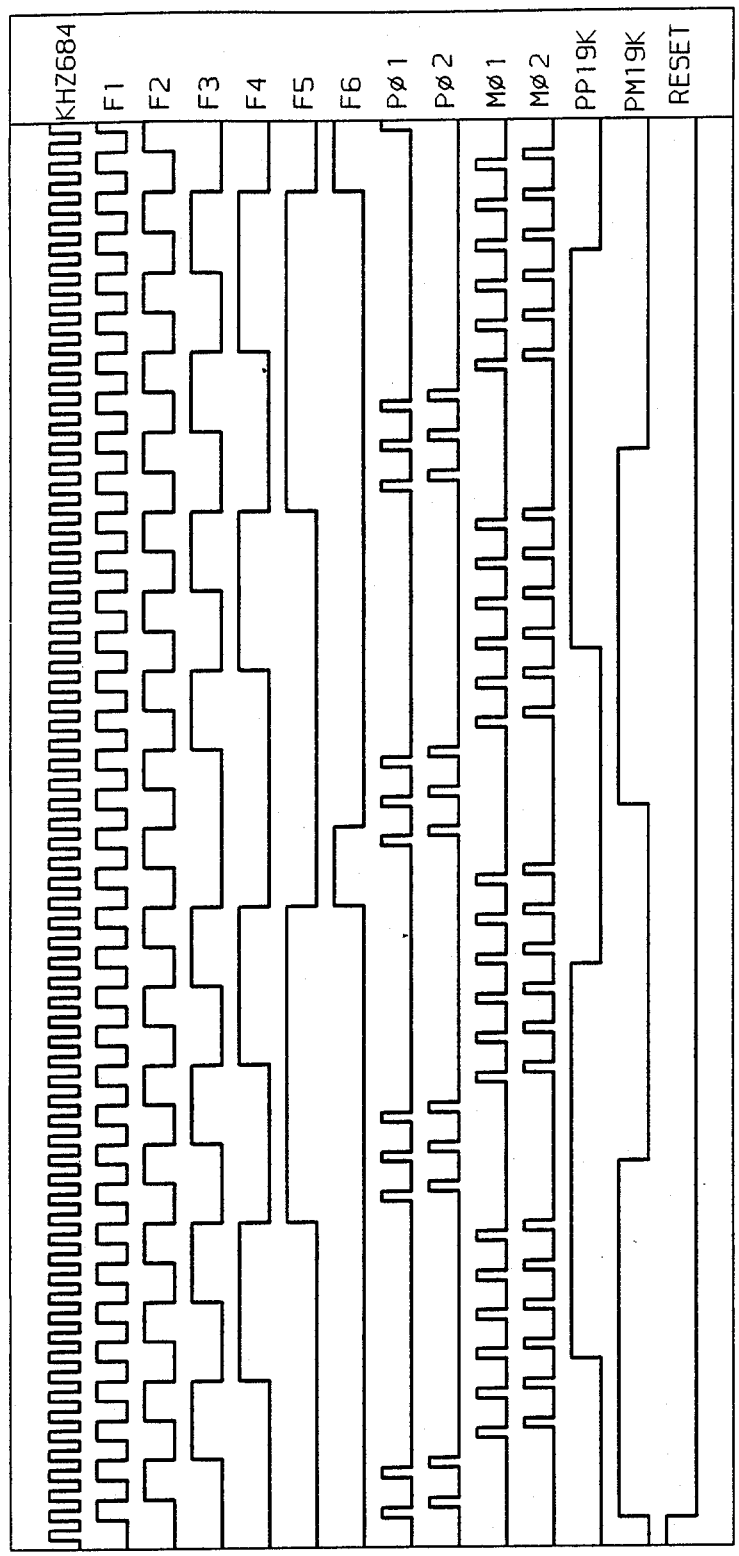
FIG. 7 show the various control signals used in the clocking the phase, and magnitude detectors.

Referring now to FIG. 6 the clock generator for controlling the detector of FIG. 5 includes a divide by 36 counter 16. The input to the counter 16 is a 50% duty cycle clock signal of frequency equal to a multiple of 12 times the 19 kHz pilot signal. In the preferred embodiment a 684 kHz clock is used. The 684 kHz clock signal is obtained from a voltage controlled oscillator as indicated in FIG. 1. The outputs F0–F6 of the counter 16 are fed to a progammable logic array (PLA) 18, which constructs the non-overlapping clock signals designated PΦ1 and PΦ2 and the polarity signal designated PP19K for use in operating the circuit of FIG. 5 as a phase detector. The PLA 18 also responds to the outputs F0–F6 to construct the non-overlapping clock signals designated MΦ1 and MΦ2 for use in operating the circuit of FIG. 5 as a magnitude detector. These signal are synchronized with the 684 KHz clock in the latches 20. The output waveforms from the latches 20 are shown in FIG. 7.

Figure 8:
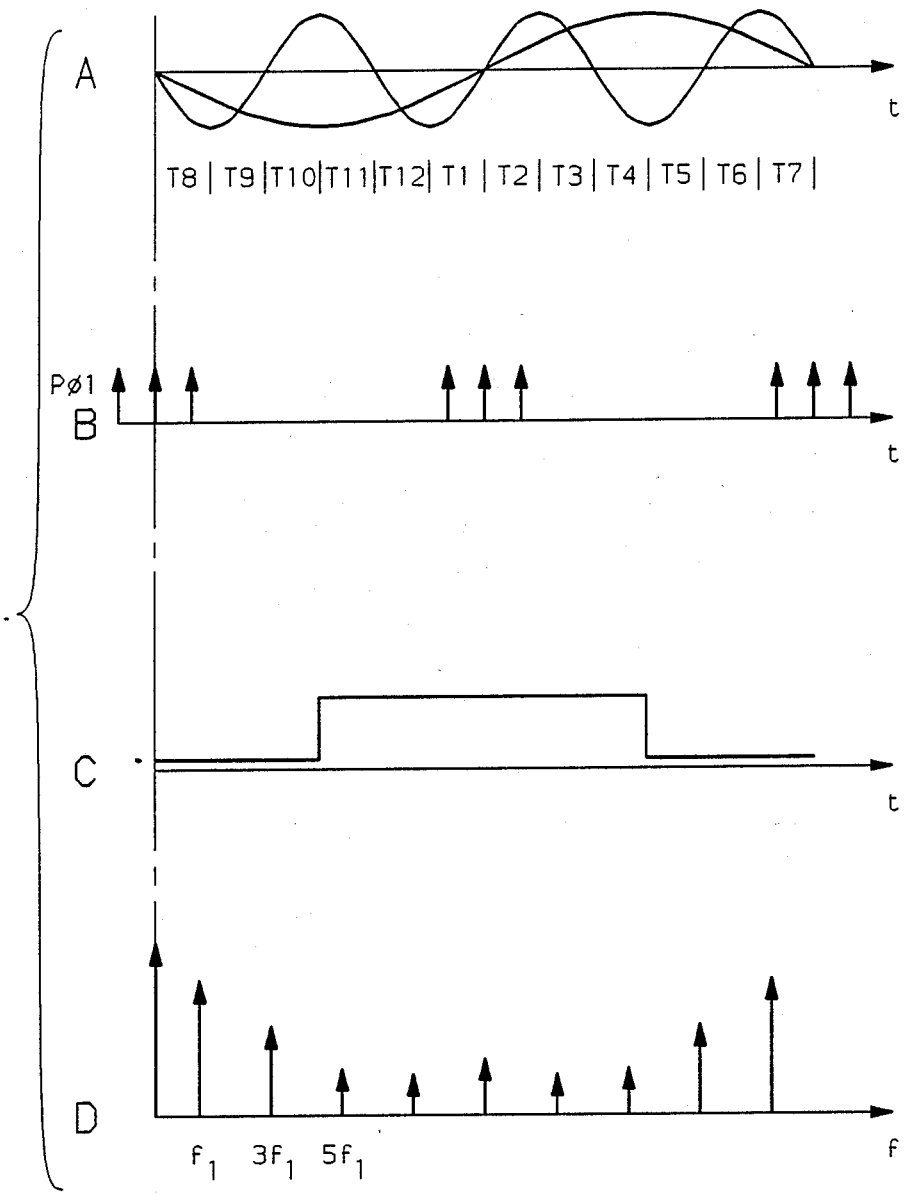
FIGS. 8A-8D show waveforms useful in explaining the clocking scheme used for a phase detector in accordance with the present invention.

Referring now to FIG. 8 the clock signals PΦ1 and PΦ2 sample the composite input signal during the time interval when the slope of the pilot signal component of the input, whether 19 kHz or 57 kHz, are of the same polarity as shown in FIG. 8A. This occurs during time intervals T1, T2 and T7, T8 of twelve equal time interval T1–T12 of the 19 kHz pilot. The polarity signal shown in FIG. 8C controls the application of the PΦ1 and PΦ2 clock signals to the switches of the low pass filter in order to achieve an alternate positive and negative unity gain respectively, during the time intervals T1, T2 and T7, T8. During the other eight time intervals, clocking is disabled producing a gain of zero. When the phase angle between the sample pulses and the pilot is zero (as depicted in FIG. 8A and 8B), the sample pulses occur symmetrically around the zero crossing of the pilot and no net voltage is sampled. However, when the phase is not zero, the samples do not cancel out (due to the synchronous rectification of the samples) and there is a net voltage sampled from the pilot. The polarity of the output voltage depends on the polarity of the phase angle. FIG. 8D shows the frequency components of the clock signal of the phase detector. It can be seen there is no response to the second and fourth harmonic, and the third harmonic is the same sign as the fundamental so the presence of a 57 kHz pilot will actually improve the gain of the 19 kHz phase detector.

Figure 9:
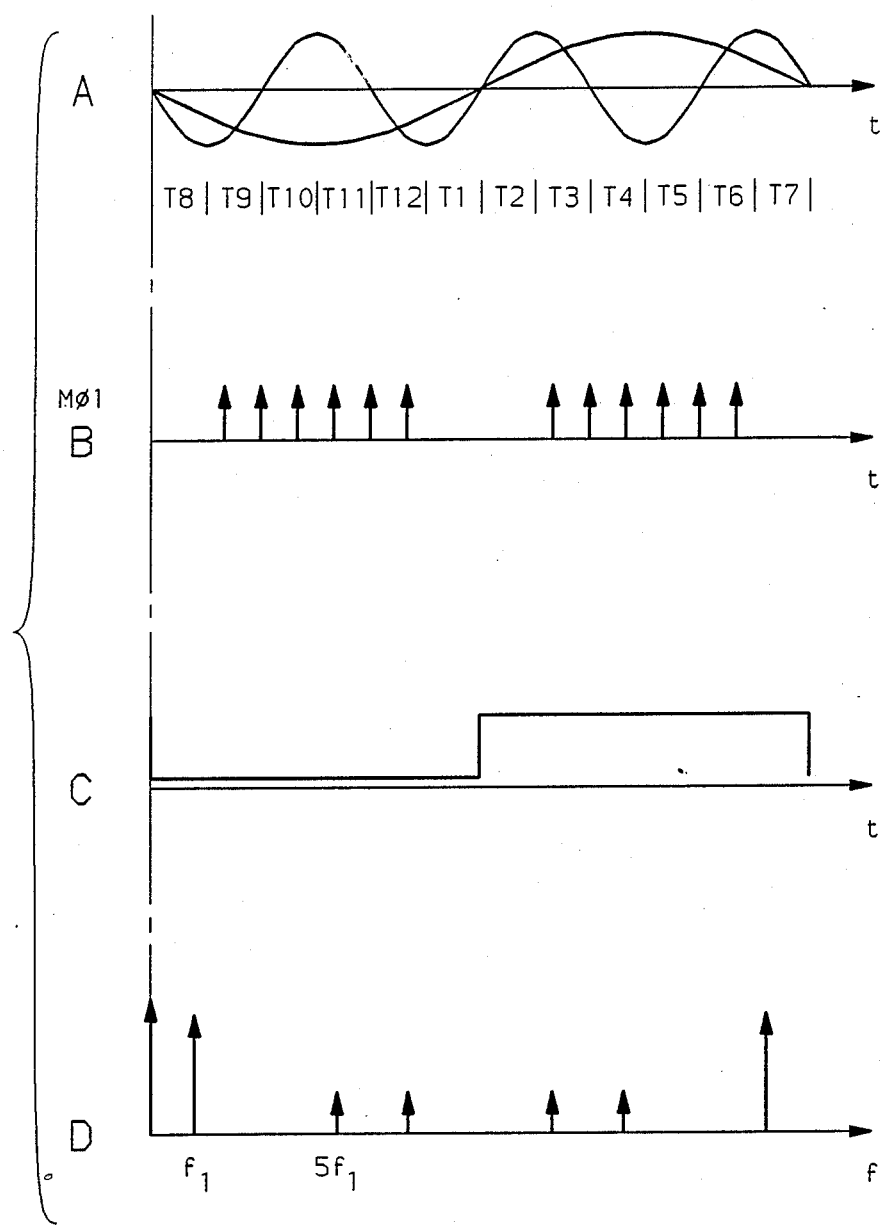
FIGS. 9A-9D show waveforms useful in explaining the clocking scheme used for a magnitude detector in accordance with the present invention.

Referring now to FIG. 9 the clock signals MΦ1 and MΦ2 sample the composite input signal during e time intervals T3–T6 and T9–T12 of the 19 kHz pilot. The polarity signal shown in FIG. 9C controls the application of the MΦ1 and MΦ2 clock signals to the switches of the low pass filter in order to achieve an alternate positive and negative unity gain respectively, during the time intervals T3–T6 and T9–T12. During the other two time intervals, clocking is disabled producing a gain of zero. When the phase angle between the sample pulses and the pilot is zero (as depicted in FIGS. 9A AND 9B), the voltage samples from the 19 kHz pilot accumulate due to the synchronous rectification. However the synchronous rectification causes the voltage sampled from a 57 kHz pilot during T3–T6 to be cancelled by the voltage sampled during T9–T12. Thus, the presence of a 57 kHz pilot does not substantially effect the DC output of the magnitude detector. FIG. 9D shows the frequency components of the clock signal of the magnitude detector. It can be seen there is no response to the second, third and fourth harmonic so the presence of a 57 kHz pilot will have no impact on the 19 kHz magnitude detector.

Figure 10:
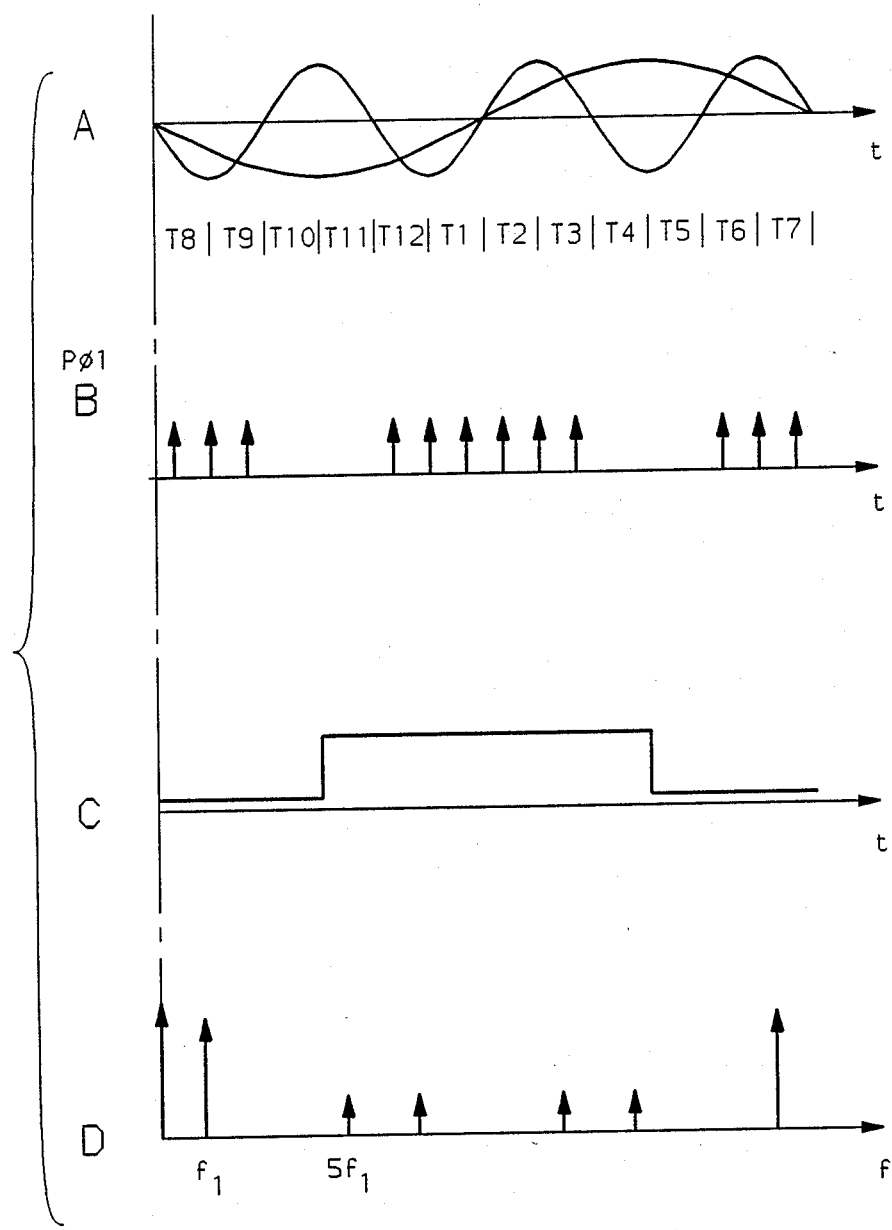
FIGS. 10A-10D show waveforms useful in explaining the clocking scheme used for a second embodiment of the phase detector of the present invention.

The clocking scheme for a second embodiment of a phase detector is show in FIG. 10. The clocking waveform of FIG. 10B and the polarity waveform of FIG. 10C are shifted by 90 degrees from the corresponding waveforms of the magnitude detector depicted in FIGS. 9B and 9C respectively. The phase detector clocking scheme of FIG. 10 is advantageously used when compatibility with the ARI 57 kHz pilot is not an issue. Since no third harmonic component is present, as indicated in FIG. 10D, the presence of information at or around 57 kHz will have no impact on the detector. A phase detector using this clocking scheme will produce a DC output of zero when the receiver and transmitter are synchronized.

The embodiments of the invention in which an exclusive property or privilege is claimed are defined as follows:

1. A stereo pilot phase detector comprising a switched capacitor low pass filter for receiving at its input an FM stereo composite signal containing a 19 kHz pilot signal, clock generator means responsive to an output of said phase detector for producing first and second non-overlapping output clock signals at a multiple of 12 times said pilot signal, means applying the clock signals to the filter to alternately produce a positive and negative unity gain during the period when the slope of the pilot signal has the same polarity as the slope of an in-phase 57 kHz pilot signal while otherwise producing a gain of zero.

2. A stereo pilot phase detector comprising a switched capacitor low pass filter for receiving at its input an FM stereo composite signal containing a 19 kHz pilot signal, clock generator means responsive to an output of said phase detector for producing first and second non-overlapping output clock signals at a multiple of 12 times the pilot signal which are applied to the filter to multiply the pilot signal by; a positive gain of 1 during the first and second of twelve equal time intervals extending over a cycle of the pilot signal, a negative gain of 1 during the seventh and eighth of said time intervals, and a gain of 0 during the remaining time intervals, the zero crossover of said 19 kHz pilot signal occurring in the middle of said remaining time intervals.

3. A stereo pilot magnitude detector comprising a switched capacitor low pass filter responsive to a stereo composite input signal containing a 19 kHz pilot signal, clock generator means producing first and second non-overlapping clock signals which are phase locked to said pilot signal and of a frequency which is a multiple of 12 times said pilot signal, means applying the clock signals to the filter to alternately produce a positive and negative unity gain during the period when the slope of the pilot signal has the opposite polarity to the slope of an in-phase 57 kHz pilot signal while otherwise producing a gain of zero.

4. A stereo pilot magnitude detector comprising a switched capacitor low pass filter responsive to a stereo composite input signal containing a 19 kHz pilot signal, clock generator means producing first and second non-overlapping output clock signals which are phase locked to said pilot signal and of a frequency which is a multiple of 12 times the 19 kHz pilot signal, means applying the clock signals to the filter to multiply the pilot signal by a positive gain of 1 during the third through sixth of twelve equal time intervals extending over a cycle of the pilot signal, by a negative gain of 1 during the ninth through twelfth of said time intervals and by a gain of 0 during the remaining ones of said time intervals, the zero crossing of said 19 kHz pilot signal occurring during the middle of said remaining ones of said time intervals, whereby the output of the detector is substantially unaffected by the presence of a 57 kHz pilot signal.

5. In an FM stereo decoder, a phase-locked loop which produces an output signal locked in phase to the 19 kHz pilot signal component of an FM Stereo composite signal, said loop including a phase detector providing a DC control voltage proportional to any phase difference between said pilot signal and said output signal, said detector comprising a switched capacitor filter circuit responsive to said composite input and to first and second non-overlapping clock signals, clock generator means for supplying said clock signals, said clock generator means responsive to the output of voltage controlled oscillator means, the frequency of said oscillator means being controlled by said DC control voltage, said clock generator means producing said first and second non-overlapping output clock signals with a frequency which is equal to a multiple of 12 times said pilot signal, said clock generator means applying the clock signals to the filter to alternately produce a positive and negative unity gain for said filter during the period when the slope of the pilot signal has the same polarity as an in-phase 57 kHz pilot signal while otherwise producing a gain of zero.

6. A phase-locked loop for an FM stereo decoder for producing an output signal locked in phase to the 19 kHz pilot signal component of an FM Stereo composite signal, said loop including a phase detector providing a DC error voltage proportional to any phase difference between said pilot signal and said output signal, said detector comprising a switched capacitor low pass filter responsive to said composite input, clock generator means responsive to said error voltage for producing first and second non-overlapping clock signals at a multiple of 12 times the 19 kHz pilot signal, means applying said clock signals to the filter to multiply the pilot signal by a positive gain of 1 during the first and second of twelve equal time intervals extending over a cycle of the pilot signal, by a negative gain of 1 during the seventh and eighth of said time intervals and by a gain of 0 during the remaining time intervals, the crossover of said 19 kHz pilot occurring in the middle of said first and second and the middle of said seventh and eighth time intervals.

7. In an FM stereo decoder, a phase-locked loop which produces an output signal locked in phase to the 19 kHz pilot signal component of an FM Stereo composite signal, said loop including a phase detector providing a DC error voltage proportional to any phase difference between said pilot signal and said output signal, voltage controlled oscillator means, the frequency of said oscillator means being controlled by said error voltage, clock generator means responsive to said voltage controlled oscillator means for providing first and second non-overlapping clock signal having a frequency equal to a multiple of 12 times said pilot signal, said detector comprising a switched capacitor filter circuit responsive to said composite input and to said first and second non-overlapping clock signals, said clock generator means applying the clock signals to the filter to alternately produce a positive and negative unity gain for said filter during the period when the slope of the pilot signal has the same polarity as an in-phase 57 kHz pilot signal while otherwise producing a gain of zero.

8. A stereo pilot phase detector comprising a switched capacitor low pass filter responsive to a stereo composite input signal containing a 19 kHz pilot signal, clock generator means producing first and second non-overlapping output clock signals which are phase locked to said pilot signal and of a frequency which is a multiple of 12 times the 19 kHz pilot signal, means applying the clock signals to the filter to multiply the pilot signal by a positive gain of 1 during the twelfth and first through third of twelve equal time intervals extending over a cycle of the pilot signal, by a negative gain of 1 during the sixth through ninth of said time intervals and by a gain of 0 during the remaining ones of said time intervals, the zero crossing of said 19 kHz pilot signal occurring between the first and second and between the seventh and eighth of said time intervals, whereby the output of the detector is substantially unaffected by the presence of a 57 kHz pilot signal.

* * * * *